(12) United States Patent
Sutardja et al.

(10) Patent No.: US 9,129,678 B2
(45) Date of Patent: Sep. 8, 2015

(54) METHOD AND APPARATUS FOR REFORMING A MEMORY CELL OF A MEMORY

(71) Applicant: Marvell World Trade Ltd., St. Michael (BB)

(72) Inventors: Pantas Sutardja, Los Gatos, CA (US); Albert Wu, Palo Alto, CA (US); Winston Lee, Palo Alto, CA (US); Peter Lee, Pleasanton, CA (US); Runzi Chang, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/536,761

(22) Filed: Nov. 10, 2014

(65) Prior Publication Data

US 2015/0063004 A1 Mar. 5, 2015

Related U.S. Application Data

(63) Continuation of application No. 14/059,790, filed on Oct. 22, 2013, now Pat. No. 8,885,388.

(60) Provisional application No. 61/717,894, filed on Oct. 24, 2012.

(51) Int. Cl.
*G11C 7/00* (2006.01)
*G11C 13/00* (2006.01)
(Continued)

(52) U.S. Cl.
CPC .......... *G11C 13/0069* (2013.01); *G11C 13/004* (2013.01); *G11C 13/0033* (2013.01);
(Continued)

(58) Field of Classification Search
CPC . G11C 13/0069; G11C 13/004; G11C 13/007
USPC ...................................... 365/148, 156, 189.14
See application file for complete search history.

(56) References Cited

U.S. PATENT DOCUMENTS

| 5,392,235 A | 2/1995 | Nishitani et al. |
| 5,706,226 A | 1/1998 | Chan et al. |

(Continued)

FOREIGN PATENT DOCUMENTS

| EP | 0011448 A1 | 5/1980 |
| EP | 1426975 A2 | 6/2004 |

(Continued)

OTHER PUBLICATIONS

Synopsys Insight Newsletter; FinFET: The Promises and the Challenges; Issue 3, 2012; 5 pages.
(Continued)

*Primary Examiner* — Connie Yoha

(57) ABSTRACT

A memory including a memory cell and first and second modules. The memory cell has first and second states, where the second state is different than the first state. The first module, subsequent to an initial forming of the memory cell and subsequent to a read cycle or a write cycle of the memory cell, determines a first difference between the first state and a first predetermined threshold or a second difference between the first state and the second state. The second module, subsequent to the first module determining the first difference or the second difference, reforms the memory cell to reset and increase the first difference or the second difference. The second module, during the reforming of the memory cell, applies a first voltage to the memory cell. The first voltage is greater than a voltage applied to the memory cell during the read cycle or the write cycle.

20 Claims, 7 Drawing Sheets

(51) Int. Cl.
*G11C 29/50* (2006.01)
*G11C 11/16* (2006.01)

(52) U.S. Cl.
CPC .......... *G11C29/50008* (2013.01); *G11C 11/16* (2013.01); *G11C 13/00* (2013.01); *G11C 2013/0076* (2013.01); *G11C 2013/0083* (2013.01)

(56) References Cited

U.S. PATENT DOCUMENTS

| | | | |
|---|---|---|---|
| 6,671,197 | B2 | 12/2003 | Athanassiadis |
| 7,382,672 | B2 | 6/2008 | Barth, Jr. et al. |
| 7,423,911 | B2 | 9/2008 | Kang |
| 7,436,708 | B2 | 10/2008 | Roohparvar |
| 7,495,944 | B2 | 2/2009 | Parkinson et al. |
| 7,499,349 | B2 | 3/2009 | Roehr |
| 7,570,524 | B2 | 8/2009 | Bedeschi et al. |
| 7,835,171 | B2 | 11/2010 | Ono et al. |
| 7,903,448 | B2 | 3/2011 | Oh et al. |
| 8,059,448 | B2 | 11/2011 | Tanigami et al. |
| 8,064,241 | B2 | 11/2011 | Morita et al. |
| 8,760,927 | B2 | 6/2014 | Deng |
| 8,817,528 | B2 | 8/2014 | Otto et al. |
| 8,885,388 | B2 | 11/2014 | Sutardja et al. |
| 2004/0252548 | A1 | 12/2004 | Tsukamoto et al. |
| 2008/0310221 | A1 | 12/2008 | Baker |
| 2009/0243652 | A1 | 10/2009 | Dorairaj et al. |
| 2009/0303785 | A1 | 12/2009 | Hwang et al. |
| 2010/0097844 | A1 | 4/2010 | Liu |
| 2010/0110762 | A1 | 5/2010 | Chen et al. |
| 2010/0142245 | A1 | 6/2010 | Kitagawa |
| 2010/0157706 | A1 | 6/2010 | Cho et al. |
| 2010/0259968 | A1 | 10/2010 | Tsushima et al. |
| 2010/0296334 | A1 | 11/2010 | Houston et al. |
| 2010/0296336 | A1 | 11/2010 | Houston |
| 2011/0007553 | A1 | 1/2011 | Takagi et al. |
| 2011/0051499 | A1 | 3/2011 | Hamilton |
| 2011/0228599 | A1 | 9/2011 | Tian et al. |
| 2012/0014171 | A1 | 1/2012 | Chuang et al. |
| 2012/0063196 | A1 | 3/2012 | Kim et al. |
| 2012/0069626 | A1* | 3/2012 | Nakano et al. ............... 365/148 |
| 2012/0087175 | A1 | 4/2012 | Zhu et al. |
| 2012/0140552 | A1 | 6/2012 | Seikh et al. |
| 2012/0155151 | A1 | 6/2012 | Rachamadugu et al. |
| 2014/0003126 | A1 | 1/2014 | Huang |
| 2014/0104926 | A1 | 4/2014 | Sutardja et al. |
| 2014/0104927 | A1 | 4/2014 | Sutardja et al. |
| 2014/0112057 | A1* | 4/2014 | Sutardja et al. ............... 365/148 |
| 2014/0119103 | A1 | 5/2014 | Lee et al. |
| 2014/0133217 | A1 | 5/2014 | Lee et al. |

FOREIGN PATENT DOCUMENTS

| | | |
|---|---|---|
| EP | 2063467 A1 | 5/2009 |
| WO | WO-2007138646 A1 | 12/2007 |
| WO | WO-2009013819 A1 | 1/2009 |

OTHER PUBLICATIONS

Notification of Transmittal of the International Search Report and the Written Opinion of The International Searching Authority, or the Declaration dated Feb. 3, 2014 in reference to PCT/US2013/067454 (13 pgs).

Xu Wang et al: "A nove 1 1 ow power 64-kb SRAM using bit-lines charge-recycling and non-uniform cell scheme", Electronics, Circuits and Systems (ICECS), 2011 18th IEEE International Conference on, IEEE, Dec. 11, 2011, pp. 528-531.

International Search Report for PCT Application No. 2013/064811 mailed Dec. 6, 2014; 3 Pages.

International Search Report for PCT/US2013/064819 dated Feb. 11, 2014; 7 Pages.

International Search Report for related PCT Application No. PCT/US2013/066303; May 16, 2014; 6 pages.

International Search Report for related PCT Application No. PCT/US2013/067441; Jan. 23, 2014; 7 pages.

International Search Report for PCT Application No. PCT/US2013/066303; May 16, 2014; 6 pages.

International Search Report for PCT Application No. PCT/US2013/067441; Jan. 23, 2014; 7 pages.

U.S. Appl. No. 14/066,796, Winston Lee et al.
U.S. Appl. No. 14/050,678, Pantas Sutardja.
U.S. Appl. No. 14/050,696, Pantas Sutardja et al.
U.S. Appl. No. 14/059,790, Pantas Sutardja et al.
U.S. Appl. No. 14/066,817, Peter Lee.

* cited by examiner

METHOD AND APPARATUS FOR REFORMING A MEMORY CELL OF A MEMORY

CROSS-REFERENCE TO RELATED APPLICATIONS

The present disclosure is a continuation of U.S. patent application Ser. No. 14/059,790 (now U.S. Pat. No. 8,885,388), filed Oct. 22, 2013. This application claims the benefit of U.S. Provisional Application No. 61/717,894, filed on Oct. 24, 2012. The entire disclosures of the application referenced above are incorporated herein by reference.

FIELD

The present disclosure relates to nonvolatile memory, and more particularly to forming of resistive memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A nonvolatile memory can include an array of memory cells. Each of the memory cells can have multiple resistive states. Certain nonvolatile memories (referred to herein as "resistive memories"), such as phase change random access memory (PRAM), resistive random access memory (RRAM), and magnetic random access memory (MRAM), include memory cells with respective resistances. Each of the resistances changes based on the state of the corresponding memory cell. For example, a memory cell can have a first (or low) resistive state when storing a '0' and a second (or high) resistive state when storing a '1'.

As a first example, in order to determine a resistive state of a memory cell, a voltage can be applied across the resistance of the memory cell. A current through the resistance can then be detected and is indicative of the resistive state. Based on the detected current, the resistive state of the memory cell is determined. As another example, a current can be supplied to the resistance of the memory cell. A voltage across the resistance can then be detected and is indicative of the resistive state. The resistive state of the memory cell can then be determined based on the detected voltage.

A resistive memory is typically only one-time "forming" capable. The term "forming" refers to activation of memory cells in a resistive memory. After manufacturing of the resistive memory, voltages can be applied to, for example, bit lines of the resistive memory to activate the memory cells. The voltages applied can be greater than the voltages applied to the bit lines during read and write operations of the resistive memory. The voltages are applied only a single time and prior to performing any read and write operations.

SUMMARY

A memory is provided and includes a memory cell, a first module, and a second module. The memory cell has a first state and a second state, where the second state is different than the first state. The first module is configured to, subsequent to an initial forming of the memory cell to activate the memory cell and subsequent to a read cycle or a write cycle of the memory cell, determine (i) a first difference between the first state and a first predetermined threshold, or (ii) a second difference between the first state and the second state. The second module is configured to, subsequent to the first module determining the first difference or the second difference, reform the memory cell to reset and increase the first difference or the second difference. The second module is configured to, during the reforming of the memory cell, apply a first voltage to the memory cell. The first voltage is greater than a voltage applied to the memory cell during the read cycle or the write cycle.

In other features, a memory is provided and includes a memory cell, a first module and a second module. The memory cell has a first state and a second state, where the second state is different than the first state. The first module is configured to, subsequent to an initial forming of the memory cell to activate the memory cell and subsequent to a read cycle or a write cycle of the memory cell, determine (i) a first difference between the first state and a first predetermined threshold, or (ii) a second difference between the first state and the second state. The second module is configured to, subsequent to the first module determining the first difference or the second difference, reform the memory cell to reset and increase the first difference or the second difference. The second module is configured to, during the reforming of the memory cell, apply a first level of current to the memory cell. The first level of current is greater than a level of current applied to the memory cell during the read cycle or the write cycle.

A method for reforming a memory cell of a memory. The memory cell has a first state and a second state. The second state is different than the first state. The method includes subsequent to an initial forming of the memory cell to activate the memory cell and subsequent to a read cycle or a write cycle of the memory cell, determining (i) a first difference between the first state and a first predetermined threshold, or (ii) a second difference between the first state and the second state. The method further includes subsequent determining the first difference or the second difference, reforming the memory cell to reset and increase the first difference or the second difference. The reforming of the memory cell includes applying a first voltage to the memory cell. The first voltage is greater than a voltage applied to the memory cell during the read cycle or the write cycle.

In other features, a memory is provided and includes an array of memory cells, a first module and a second module. The first module is configured to compare a first state of a memory cell with a reference. The memory cell is in the array of memory cells. The second module is configured to, subsequent to a read cycle or a write cycle of the memory cell and based on the comparison, reform the memory cell to adjust a difference between the first state and a second state of the memory cell.

In other features, the reference is the second state and the first module is configured to determine the difference between the first state and the second state. In yet other features, the reference is a predetermined threshold.

In other features, the first module is configured to determine the difference between the first state and the second state. The second module is configured to, based on the difference, reform the memory cell to adjust the first state and the second state. Subsequent to the reforming of the memory cell, a second difference between the first state or the second state is greater than a predetermined difference.

In other features, the first module is configured to determine a second difference between a predetermined threshold and the first state, and determine a third difference between a second predetermined threshold and the second state. The second module is configured to, based on the second difference or the third difference, reform the memory cell to adjust the first state and the second state.

In other features, the first module is configured to determine whether the first state is less than a first predetermined threshold or whether the second state is greater than a second predetermined threshold. The second module is configured to reform the memory cell if the first state is less than the first predetermined threshold or the second state is greater than the second predetermined threshold.

In other features, the first state is indicative of a first resistance of the memory cell. The second state is indicative of a second resistance of the memory cell. The second module is configured to, based on the difference or the comparison, increase the first state or decrease the second state.

In other features, the memory includes a third module. The second module is configured to, via the third module, apply a voltage or a level of current to the memory cell while reforming the memory cell.

In other features, a network device is provided and includes a resistive memory, a first module and a second module. The resistive memory includes an array of memory cells. The first module is configured to compare a first state of a memory cell with a reference. The memory cell is in the array of memory cells. The second module is configured to, subsequent to a read cycle or a write cycle of the memory cell and based on the comparison, reform the memory cell to adjust a difference between the first state and a second state of the memory cell.

In other features, at least one of the first module or the second module are implemented in the resistive memory.

In other features, the resistive memory is a first resistive memory. The network device further includes a second resistive memory including a second array of memory cells. The first module is configured to determine a third difference between a third state and a fourth state of a second memory cell in the second array of memory cells. The second module is configured to reform the second memory cell based on the third difference to reset the third state and the fourth state such that, subsequent to the reforming of the second memory cell, a fourth difference between the third state and the fourth state is greater than a predetermined difference.

In other features, a method is provided and includes comparing a first state of a memory cell with a reference. The memory cell is in an array of memory cells. The first state is indicative of a first resistance of the memory cell. Subsequent to a read cycle or a write cycle of the memory cell and based on the comparison, reforming the memory cell to adjust a difference between the first state and a second state of the memory cell. The second state is indicative of a second resistance of the memory cell.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

A resistive memory includes an array of memory cells. Each of the memory cells includes a resistance, which indicates a state of the corresponding memory cell. The resistance may be in a HIGH resistive state indicating that the memory cell is storing a '1' or may be in a LOW resistive state indicating that the memory cell is storing a '0'. A difference in resistances between the HIGH resistive state and the LOW resistive state may decrease over time and cycled use of the memory cell. Subsequent to a predetermined number (e.g., 10,000) of read and/or write cycles of a memory cell of a resistive memory, the corresponding difference between HIGH and LOW resistive states of the memory cell can decrease to less than a predetermined difference.

A sense amplifier or other detection circuit of a resistive memory may not be able to distinguish between HIGH and LOW resistive states of a memory cell when the difference between the HIGH and LOW resistive states is less than the predetermined difference. This can cause read and/or write inaccuracies and/or errors. A memory cell with a difference between HIGH and LOW resistive states that is less than the predetermined difference may be referred to as a failed memory cell. An output of a failed memory cell may be referred to as a failure.

The following disclosed examples allow for reforming of memory cells to reset the differences between resistive states (e.g., HIGH and LOW resistive states) of each of the memory cells. Reforming may include applying voltages and/or levels of current as described below to increase first resistive states and decrease second resistive states. Increasing first resistive states may include increasing resistances of memory cells to increase voltages and/or levels of current detected during a read of the first resistive states. Decreasing second resistive states may include decreasing resistances of memory cells to decrease voltages and/or levels of current detected during a read of the second resistive states. Subsequent to being reset, the differences between the resistive states of each of the memory cells may be greater than predetermined differences and may be as large as differences between the resistive states provided as a result of initial forming. Initial forming is performed subsequent to manufacturing and prior to performing any read and/or write cycles on the memory cells. The reforming resets resistive states of the memory cells to levels that are distinguishable by a detection circuit, which extends endurance and useful life of the memory cells.

Figure 1:
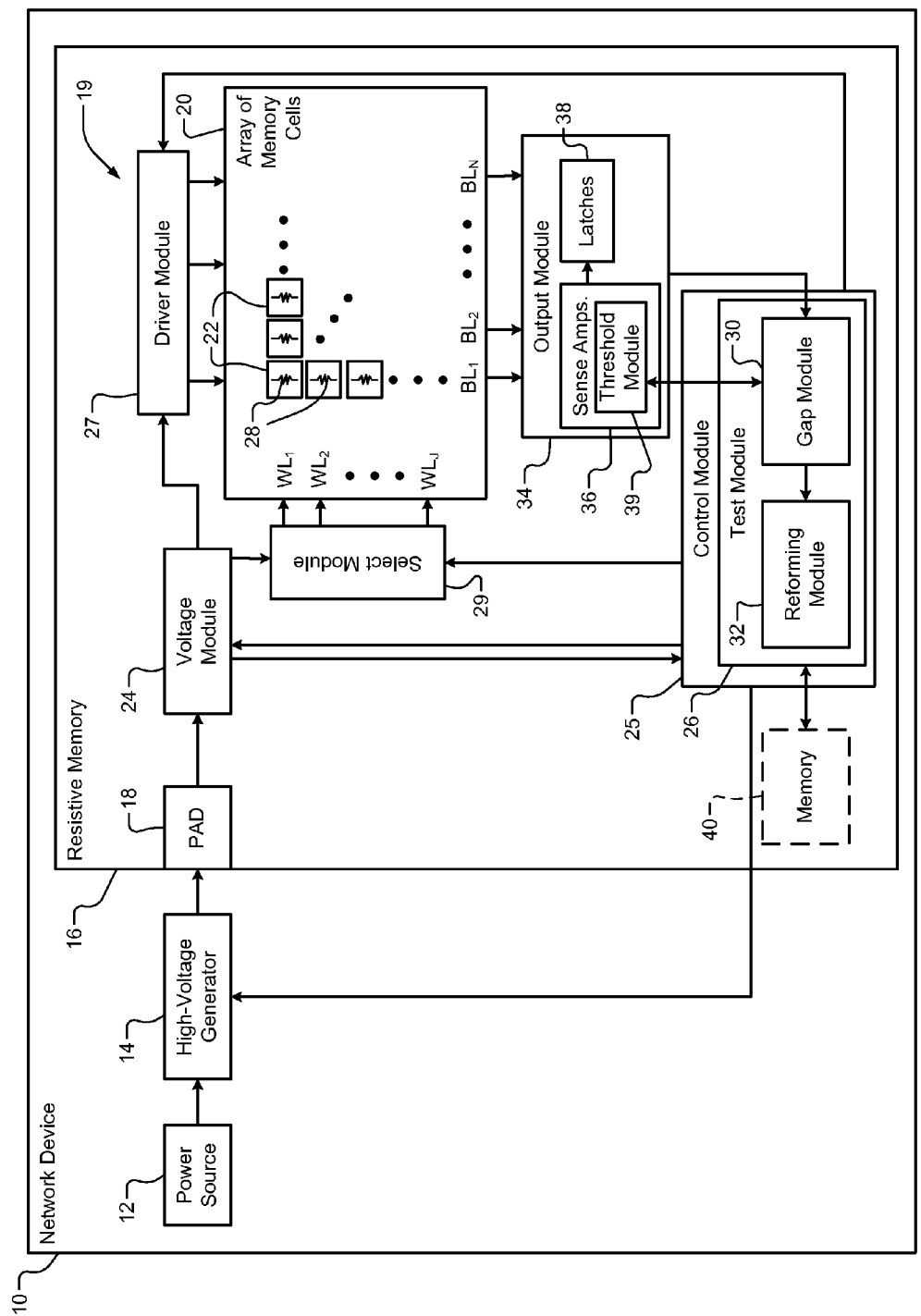
FIG. 1 is a functional block diagram of a network device incorporating resistive memory with a test module in accordance with the present disclosure.

FIG. 1 shows a network device 10. The network device 10 includes a power source 12, a high-voltage generator (or power converter) 14, and a resistive memory 16. The network device 10 may be, for example, a computer, a mobile device, a cellular phone, a storage device, a network device, other device that includes resistive memory. The power source 12 may include, for example, a battery, a battery pack, and/or other power source. The power source 12 provides power to the high-voltage generator 14. The high-voltage generator 14 may convert and/or regulate an output voltage of the power source 12 to generate a predetermined voltage. The predetermined voltage may be greater than the output voltage of the power source 12 and may be suitable for operation of the resistive memory 16.

The resistive memory 16 may be a storage drive, a flash drive, a memory card, a memory stick, an integrated circuit, or other device or circuit element that includes resistive memory cells. The resistive memory 16 may be plugged into the network device 10 via an interface between the network device 10 and the resistive memory 16 or may be implemented within the network device 10, as shown. The resistive memory 16 receives power from the high-voltage generator 14 via a pad 18 on the resistive memory 16.

The resistive memory 16 includes a memory circuit 19 with an array 20 of memory cells 22, a voltage module 24, a control module 25 with a test module 26, a driver module 27 and a select module 29. The array 20 may include rows and columns of the memory cells 22 that are selected via respective word lines $WL_{1-J}$ and bit lines $BL_{1-N}$, where J and N are integers greater than one. The memory cells 22 may include respective resistances 28 to which a voltage and/or a current may be applied via a driver module 27. The voltage and/or current may be applied to select and/or enable one or more of the bit lines $BL_{1-N}$ and/or to read one or more of the memory cells 22. Voltages across and/or currents through each of the resistances 28 may be detected to determine resistive states of the resistances 28. The select module 29 may be used to select the word lines $WL_{1-J}$.

The memory cells 22 are resistive memory cells with the respective resistances 28 and corresponding resistive states. Although the memory cells disclosed herein are primarily described as having two resistive states (e.g., HIGH and LOW resistive states), the resistive states of each of the memory cells 22 may include more than two resistive states. Voltages and/or levels of current may be applied to bit lines (e.g., bit lines $BL_{1-N}$) and/or word lines (e.g., bit lines $WL_{1-J}$) of the array 20 when performing read, write and reforming operations. The voltages and/or levels of current may be applied via the driver module 27 and/or the select module 29. The voltages and/or levels of current applied during reforming may be greater than the voltages and/or levels of current applied during the read and write operations.

The voltage module 24 receives the predetermined voltage supplied to the pad 18. Based on the predetermined voltage, the voltage module 24 may regulate, adjust, and/or supply one or more voltages and/or one or more levels of current to each of the array 20 of memory cells 22, a test module 26 and/or other modules, and/or elements of the resistive memory 16.

The control module 25 may control read and write operations and/or access to the array 20 of memory cells 22. The test module 26 includes a gap module 30 and a reforming module 32. The gap module 30 periodically, at predetermined times, after a predetermined number of read and/or write cycles, at random times, and/or at other suitable times performs one or more tests on the array 20 of memory cells 22. Each test may include detecting voltages across and/or levels of current through one or more of the resistances 28 of the memory cells 22 to determine differences between resistive states of the memory cells 22. During a test, a first resistive state of a memory cell may be detected. The test module 26 and/or the gap module 30 may monitor when the first resistive state is changed to a second resistive state and/or may write to the memory cell to change the first resistive state of the memory cell to a second resistive state. The second resistive state being different than the first resistive state. The gap module 30 determines the difference between the first resistive state and the second resistive state.

The reforming module 32 monitors the one or more differences determined by the gap module 30. The reforming module 32 may reform one or more of the memory cells 22 based on the one or more differences. This may include applying one or more voltages and/or levels of current to one or more of the resistances 28 of corresponding memory cells to reset resistive states of the corresponding memory cells. The one or more voltages and/or levels of current are applied such that resulting differences are each greater than a predetermined difference. The voltages and/or levels of current applied to the one or more memory cells are greater than the voltages and/or levels of current supplied to the memory cells during read and/or write cycles.

As a first example, the reforming module 32 may reform a memory cell when a difference corresponding to the memory cell is less than a predetermined difference. As another example, two or more memory cells may be reformed based on one or more differences in resistive states of one or more memory cells. As yet another example, one or more groups of memory cells may be reformed based on differences corresponding to one or more memory cells in and/or external to the one or more groups of memory cells.

The test module 26 may control the high-voltage generator 14, the voltage module 24, the driver module 27 and/or the select module 29 when performing a test and/or reforming one or more of the memory cells 22. The test module 26 may send control signals to one or more of the modules 14, 24, 27, 29 instructing the modules 14, 24, 27, 29 to generate voltages and/or levels of current to perform read, write and/or reforming operations.

The resistive memory 16 further includes an output module 34. The output module 34 may include, for example, sense amplifiers 36 and latches 38 for detecting voltages and/or levels of current passing through the resistances 28 of the memory cells 22. The detected voltages and/or levels of current and/or corresponding voltages and/or levels of current out of the sense amplifiers 36 and/or the latches 38 may be provided from the output module 34, the sense amplifiers 36 and/or the latches 38 to the gap module 30. The gap module 30 then determines differences between resistive states of the resistances 28 of the memory cells 22 based on the voltages and/or levels of current received by the gap module 30. Although the gap module 30 is shown in the test module 26, the gap module 30 may be incorporated in the output module 34.

In another implementation, the gap module 30 and/or the sense amplifiers 36 may include one or more threshold modules (one threshold module 39 is shown as being included in the sense amplifiers 36). The gap module 30 may set predetermined threshold values and provide predetermined threshold values to the threshold module 39. The sense amplifiers 36, threshold module 39, and/or the gap module 30 may compare voltages across and/or levels of current through one or more of the resistances 28 and to the corresponding predetermined threshold values. A first predetermined threshold value may be used to determine whether a first resistive state (or HIGH state) is too low. A second predetermined threshold value may be used to determine whether a second resistive state (or LOW state) is too high. For example, if a first voltage or level of current detected for a memory cell for the first resistive state is less than the first predetermined threshold value, then a corresponding sense amplifier and/or the gap module 30 may indicate that the memory cell should be reformed. As another example, if a second voltage or level of current detected for the memory cell for the second resistive state is greater than the second predetermined threshold value, then the sense amplifier and/or the gap module 30 may indicate that the memory cell should be reformed.

Additional memory 40 may be included in the network device 10 and/or in the resistive memory 16, as shown. The memory 40 may be used to store the voltages and/or levels of current received by the gap module 30 and/or resistive state values determined by the gap module 30. The memory 40 may also be used to store differences in resistive states as determined by the gap module 30 and differences between (i) the voltages, the levels of current, and/or the resistive states, and (ii) corresponding predetermined threshold values. The memory 40 may also store addresses of memory cells to be reformed. The differences corresponding to resistive states of a memory cell may refer to differences between voltages, differences between levels of current, and/or differences between resistance values of the memory cell. Some or all of the above-stated voltages, levels of current, resistive state values, the stated differences, and/or addresses of memory cells to be reformed may be stored in the array 20 rather than in the memory 40.

Figure 2:
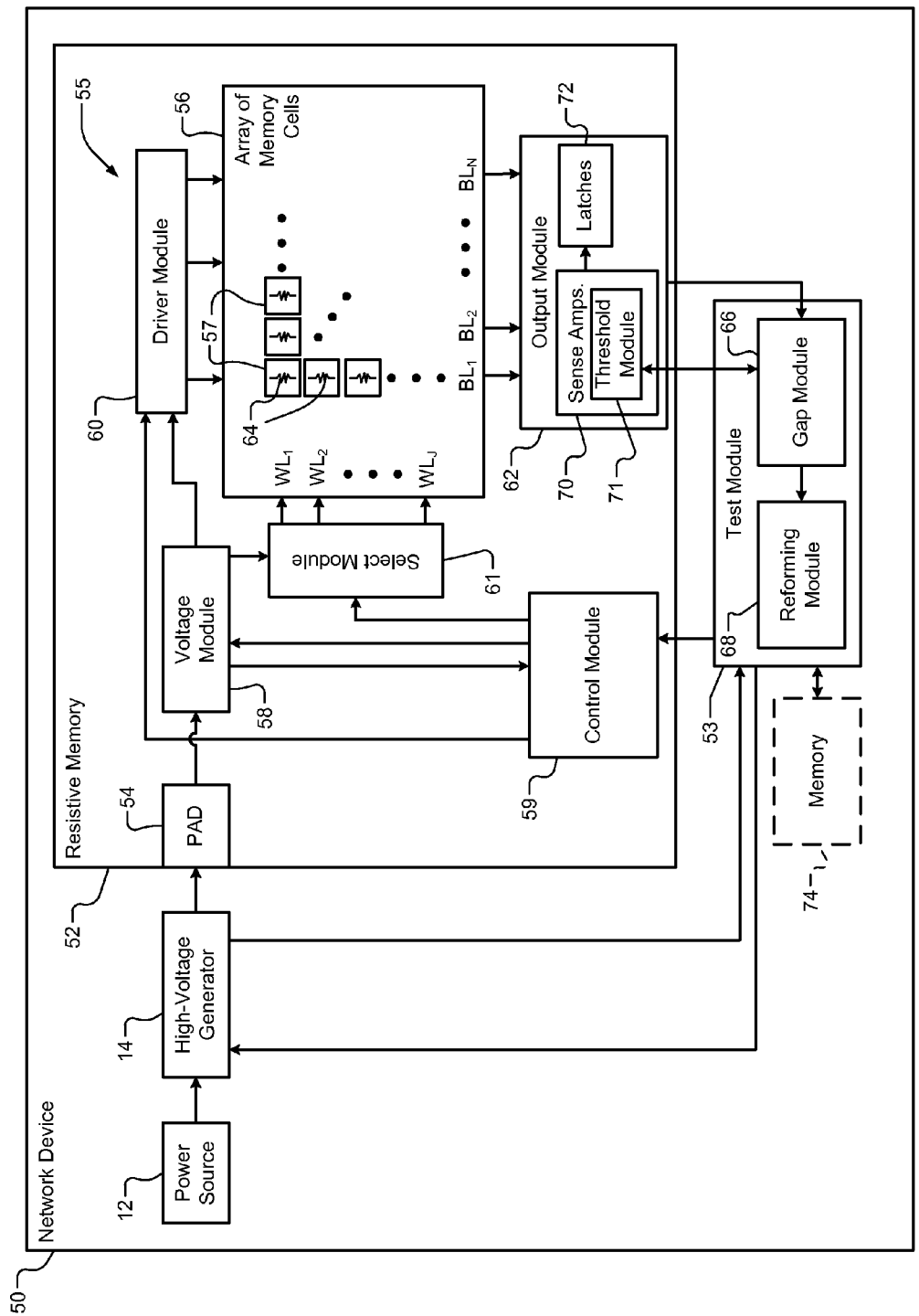
FIG. 2 is a functional block diagram of a network device incorporating resistive memory and a test module in accordance with the present disclosure.

FIG. 2 shows a network device 50. The network device 50 operates similar to the network device 10 of FIG. 1. FIG. 2 illustrates an implementation with a test module external to a resistive memory. The network device 50 includes the power source 12, the high-voltage generator 14, a resistive memory 52, and a test module 53. The network device 50 may be, for example, a computer, a mobile device, a cellular phone, a storage device, a network device, other device that includes resistive memory. The high-voltage generator 14 may generate a predetermined voltage. The predetermined voltage may be greater than an output voltage of the power source 12 and may be suitable for operation of the resistive memory 52. The high-voltage generator 14 may also power the test module 53.

The resistive memory 52 may be a storage drive, a flash drive, a memory card, a memory stick, an integrated circuit, or other device or circuit element that includes resistive memory cells. The resistive memory 52 may be plugged into the network device 50 via an interface between the network device 50 and the resistive memory 52 or may be implemented within the network device 50, as shown. The resistive memory 52 receives power from the high-voltage generator 14 via a pad 54 on the resistive memory 52.

The resistive memory 52 includes a memory circuit 55 with an array 56 of memory cells 57, a voltage module 58, a control module 59, a driver module 60, the select module 61, and an output module 62. The memory cells 57 may include the resistances 64. The array 56 may include rows and columns of the memory cells 57 that are selected via respective word lines $WL_{1-J}$ and bit lines $BL_{1-N}$. The memory circuit 55 may operate similar to the memory circuit 19 of FIG. 1. Thus, the array 56 of memory cells 57 and the modules 58, 59, 60, 61 and 62 of FIG. 2 operate similar to the array 20 of memory cells 22 and modules 24, 25, 27, 29, 34 of FIG. 1.

Referring again to FIG. 2, the test module 53 includes a gap module 66 and a reforming module 68. Although the gap module 66 is shown in the test module 26, the gap module 66 may be incorporated in the output module 62. The gap module 66 periodically, at predetermined times, after a predetermined number of read and/or write cycles, at random times, and/or at other suitable times performs one or more tests on the array 56 of memory cells 57. Each test may include detecting voltages across and/or levels of current through one or more of the resistances 64 of corresponding memory cells to determine differences between resistive states of the corresponding memory cells. During a test, a first resistive state of a memory cell may be detected. The test module 53 and/or the gap module 66 may monitor when the first resistive state is changed to a second resistive state and/or may write to the memory cell to change the first resistive state of the memory cell to a second resistive state. The second resistive state being different than the first resistive state. The gap module 66 determines the difference between the first resistive state and the second resistive state.

The reforming module 68 monitors the one or more differences determined by the gap module 66. The reforming module 68 may reform one or more of the memory cells 57 based on the one or more differences. This may include the test module 53 sending control signals to the control module 59 to apply one or more voltages and/or levels of current to one or more of the resistances 64 of the memory cells 57 to reset resistive states of the memory cells 57. The one or more voltages and/or levels of current are applied such that each resulting difference in resistive states of the one or more of the resistances 64 is greater than a predetermined difference. The voltages and/or levels of current applied to the one or more memory cells are greater than the voltages and/or levels of current supplied to the memory cells during read and/or write cycles. The reforming module 68 may reform one or more memory cells, as described above with respect to the reforming module 32 of FIG. 1.

The test module 53 may send control signals to the control module 59 to control the high-voltage generator 14, the voltage module 58, the driver module 60, and/or the select module 61 when performing a test and/or reforming one or more of the memory cells 57. Based on the control signals from the test module 53, the control module 59 may send control signals to one or more of the modules 14, 58, 59, 60 instructing the modules 14, 58, 59, 60 to generate voltages and/or levels of current to perform read, write and/or reforming operations.

The output module 62 may include, for example, sense amplifiers 70 and the latches 72 for detecting voltages and/or levels of current passing through the resistances 64 of the memory cells 57. The detected voltages and/or levels of current and/or corresponding voltages and/or levels of current out of the sense amplifiers 70 and/or the latches 72 may be provided from the output module 62, the sense amplifiers 70 and/or the latches 72 to the gap module 66. The gap module 66 then determines differences between resistive states of the resistances 64 of the memory cells 57 based on the voltages and/or levels of current received by the gap module 66.

In another implementation, the gap module 66 and/or the sense amplifiers 70 may include one or more threshold modules (one threshold module 71 is shown as being included in the sense amplifiers 70). The gap module 66 may set predetermined threshold values and provide predetermined threshold values to the threshold module 71. The sense amplifiers 70, the threshold module 71, and/or the gap module 66 may compare voltages across and/or levels of current through one or more of the resistances 64 and to the corresponding predetermined threshold values. A first predetermined threshold value may be used to determine whether a first resistive state (or HIGH state) is too low. A second predetermined threshold value may be used to determine whether a second resistive state (or LOW state) is too high. For example, if a first voltage or level of current detected for a memory cell for the first resistive state is less than the first predetermined threshold value, then a corresponding sense amplifier and/or the gap module 66 may indicate that the memory cell should be reformed. As another example, if a second voltage or level of current detected for the memory cell for the second resistive state is greater than the second predetermined threshold value, then the sense amplifier and/or the gap module 66 may indicate that the memory cell should be reformed.

Additional memory 74 may be included in the resistive memory 52 and/or in the network device 50, as shown. The memory 74 may be used to store the voltages and/or levels of current received by the gap module 66 and/or resistive state values determined by the gap module 66. The memory 74 may also be used to store differences in resistive states as determined by the gap module 66 and differences between (i) the voltages, the levels of current, and/or the resistive states, and (ii) corresponding predetermined threshold values. The memory 74 may also store addresses of memory cells to be reformed. The differences corresponding to resistive states of a memory cell may refer to differences between voltages, differences between levels of current, and/or differences between resistance values of the memory cell. Some or all of the above-stated voltages, levels of current, resistive state values, the stated differences, and/or addresses of memory cells to be reformed may be stored in the array 56 rather than in the memory 74.

Figure 3:
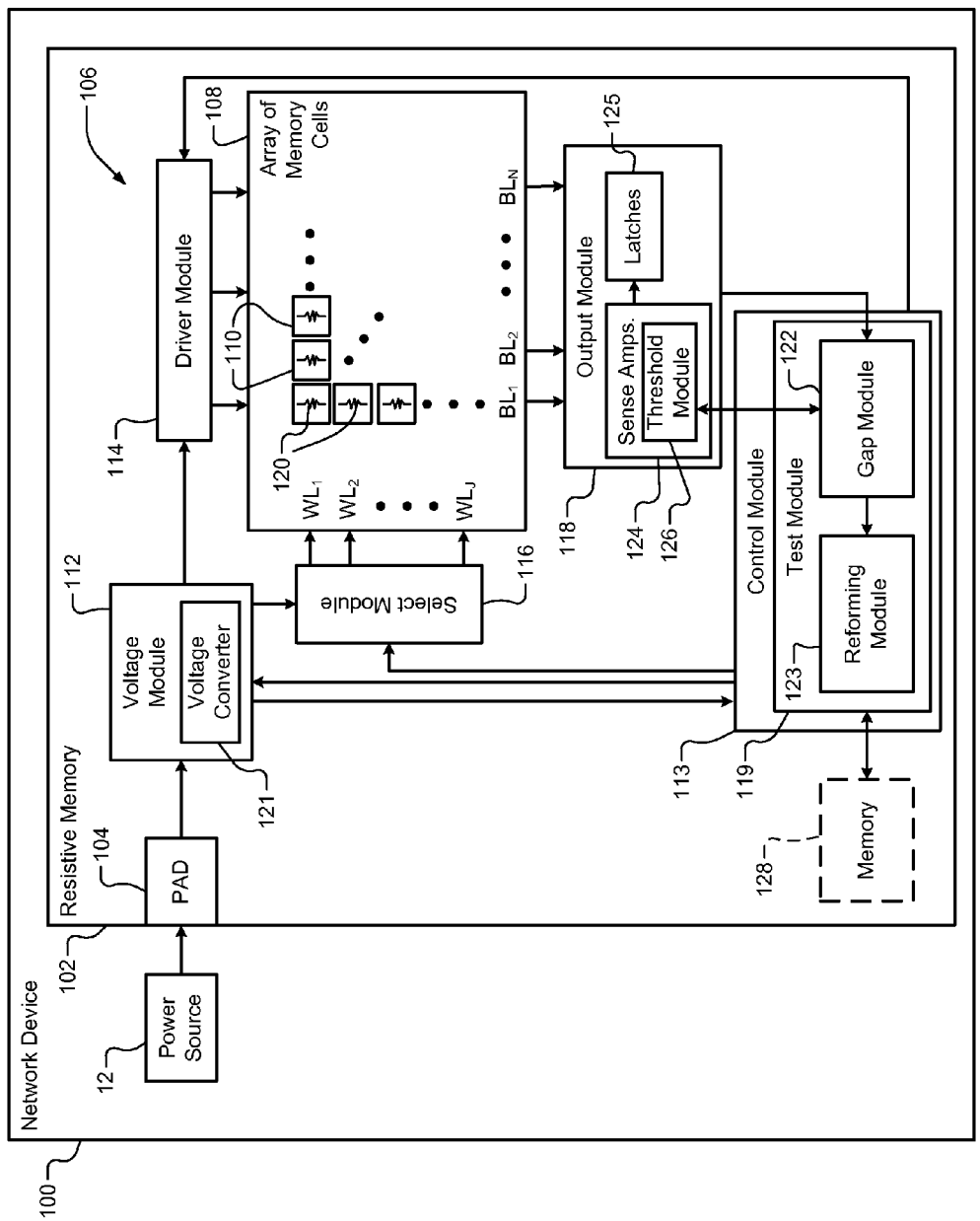
FIG. 3 is a functional block diagram of a network device incorporating resistive memory with a voltage converter and a test module in accordance with the present disclosure.

FIG. 3 shows a network device 100. The network device 100 operates similar to the network device 10 of FIG. 1. FIG. 2 illustrates an implementation without a high-voltage converter between a power source and a resistive memory. The network device 100 includes the power source 12 and a resistive memory 102. The network device 100 may be, for example, a computer, a mobile device, a cellular phone, a storage device, a network device, other device that includes resistive memory. The power source 12 may supply power to the resistive memory 102 via a pad 104 on the resistive memory 102.

The resistive memory 102 may be a storage drive, a flash drive, a memory card, a memory stick, an integrated circuit, or other device or circuit element that includes resistive memory cells. The resistive memory 102 may be plugged into the network device 100 via an interface between the network device 100 and the resistive memory 102 or may be implemented within the network device 100, as shown.

The resistive memory 102 includes a memory circuit 106 with an array 108 of memory cells 110, a voltage module 112, a control module 113, a driver module 114, the select module 116, an output module 118, and a test module 119. The memory cells 110 may include the resistances 120. The array 108 may include rows and columns of the memory cells 110 that are selected via respective word lines $WL_{1-J}$ and bit lines $BL_{1-N}$. The memory circuit 106 may operate similar to the memory circuit 19 of FIG. 1. Thus, the array 108 of memory cells 110 and the modules 112, 113, 114, 116, 118, 119 of FIG. 3 operate similar to the array 20 of memory cells 22 and modules 24, 25, 27, 29, 34, 26 of FIG. 1.

Referring again to FIG. 3, the voltage module 112 may include a voltage converter 121 for converting a voltage received from the pad 104 to one or more predetermined voltages. The one or more predetermined voltages may be provided from the voltage converter 121 to the driver module 114 and the select module 116.

The control module 113 includes the test module 119. The test module 119 includes a gap module 122 and a reforming module 123. Although the gap module 122 is shown in the test module 119, the gap module 122 may be incorporated in the output module 118. The gap module 122 periodically, at predetermined times, after a predetermined number of read and/or write cycles, at random times, and/or at other suitable times performs one or more tests on the array 108 of memory cells 110. Each test may include detecting voltages across and/or levels of current through one or more of the resistances 120 of corresponding memory cells to determine differences between resistive states of the corresponding memory cells. During a test, a first resistive state of a memory cell may be detected. The test module 119 and/or the gap module 122 may monitor when the first resistive state is changed to a second resistive state and/or may write to the memory cell to change the first resistive state of the memory cell to a second resistive state. The second resistive state being different than the first resistive state. The gap module 122 determines the difference between the first resistive state and the second resistive state.

The reforming module 123 monitors the one or more differences determined by the gap module 122. The reforming module 123 may reform one or more of the memory cells 110 based on the one or more differences. This may include applying one or more voltages and/or levels of current to one or more of the resistances 120 of the memory cells 110 to reset resistive states of the memory cells 110. The one or more voltages and/or levels of current are applied such that each resulting difference in resistive states of the one or more resistances 120 is greater than a predetermined difference. The voltages and/or levels of current applied to the one or more memory cells are greater than the voltages and/or levels of current supplied to the memory cells during read and/or write cycles.

The test module 119 may control the voltage module 112, the driver module 114, the select module 116, and/or the voltage converter 121 when performing a test and/or reforming one or more of the memory cells 110. The test module 119 may send control signals to one or more of the modules 112, 114, 116 and the voltage converter 121 instructing the modules 112, 114, 116 and the voltage converter 121 to generate voltages and/or levels of current to perform read, write and/or reforming operations.

The output module 118 may include, for example, sense amplifiers 124 and latches 125 for detecting voltages and/or levels of current passing through the resistances 120 of the memory cells 110. The detected voltages and/or levels of current and/or corresponding voltages and/or levels of current out of the sense amplifiers 124 and/or the latches 125 may be provided from the output module 118, the sense amplifiers 124 and/or the latches 125 to the gap module 122. The sense amplifiers 124 may include a threshold module 126, which may operate similar to the threshold module 39 of FIG. 1. The gap module 122 then determines differences between resistive states of the resistances 120 of the memory cells 110 based on the voltages and/or levels of current received by the gap module 122.

Additional memory 128 may be included in the resistive memory 102 and/or in the network device 100, as shown. The memory 128 may be used to store the voltages and/or levels of current received by the gap module 122 and/or resistive state values determined by the gap module 122. The memory 128 may also be used to store differences in resistive states as determined by the gap module 122 and differences between (i) the voltages, the levels of current, and/or the resistive states, and (ii) corresponding predetermined threshold values. The memory 128 may also store addresses of memory cells to be reformed. The differences corresponding to resistive states of a memory cell may refer to differences between voltages, differences between levels of current, and/or differences between resistance values of the memory cell. Some or all of the above-stated voltages, levels of current, resistive state values, the stated differences, and/or addresses of memory cells to be reformed may be stored in the array 108 rather than in the memory 128.

Figure 4:
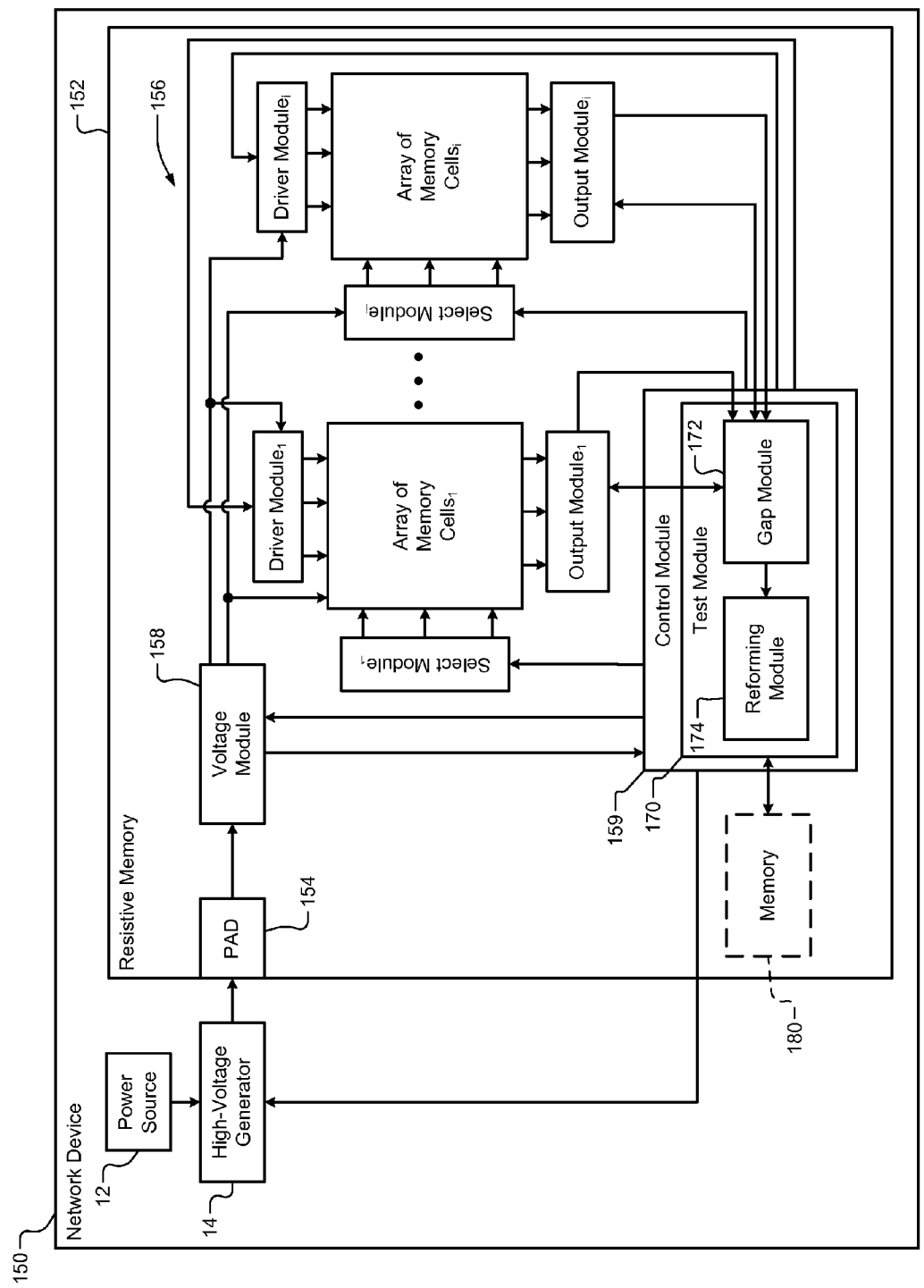
FIG. 4 is a functional block diagram of a network device incorporating resistive memory with multiple arrays of memory cells and a test module in accordance with the present disclosure.

FIG. 4 shows a network device 150. The network device 150 operates similar to the network device 10 of FIG. 1. FIG. 4 illustrates an implementation with a resistive memory having multiple arrays of memory cells. The network device 150 includes the power source 12, the high-voltage generator 14, and a resistive memory 152. The network device 150 may be, for example, a computer, a mobile device, a cellular phone, a storage device, a network device, other device that includes resistive memory. The high-voltage generator may supply a predetermined voltage to a pad 154 of the resistive memory based on power received from the power source 12.

The resistive memory 152 may be a storage drive, a flash drive, a memory card, a memory stick, an integrated circuit, or other device or circuit element that includes resistive memory cells. The resistive memory 152 may be plugged into the network device 150 via an interface between the network device 150 and the resistive memory 152 or may be implemented within the network device 150, as shown.

The resistive memory 152 includes a memory circuit 156 with arrays of memory cells$_{1-i}$, a voltage module 158, a control module 159, respective driver modules$_{1-i}$, respective select modules$_{1-i}$, respective output modules$_{1-i}$, and a test module 170, where i is an integer greater than one. Each of the arrays of memory cells$_{1-i}$ may include resistive memory cells and corresponding resistances similar to the arrays of memory cells shown in FIGS. 1-3. The arrays of memory cells$_{1-i}$ may include respective rows and columns that are selected via respective word lines and bit lines. Each of the arrays of memory cells$_{1-i}$ may operate similar to the array 20 of memory cells 22 of FIG. 1.

The voltage module 158 may generate one or more voltages and provide the voltages to the driver modules$_{1-i}$ and the select modules$_{1-i}$. In one implementation, the driver modules$_{1-i}$ and the select modules$_{1-i}$ may receive the same voltage from the voltage module 158. In another implementation, the driver modules$_{1-i}$ and the select modules$_{1-i}$ receive respective voltages from the voltage module 158. Two or more of the respective voltages may be the same or different.

The control module 159 includes the test module 170. The test module 170 includes a gap module 172 and a reforming module 174. The gap module 172 periodically, at predetermined times, after a predetermined number of read and/or write cycles, at random times, and/or at other suitable times performs one or more tests on the arrays of memory cells$_{1-i}$. Each test may include detecting voltages across and/or levels of current through one or more of the resistances of corresponding memory cells in the arrays of memory cells$_{1-i}$ to determine differences between resistive states of the corresponding memory cells. During a test, a first resistive state of a memory cell may be detected. The test module 170 and/or the gap module 172 may monitor when the first resistive state is changed to a second resistive state and/or may write to the memory cell to change the first resistive state of the memory cell to a second resistive state. The second resistive state being different than the first resistive state. The gap module 172 determines the difference between the first resistive state and the second resistive state.

The reforming module 174 monitors the one or more differences determined by the gap module 172. The reforming module 174 may reform one or more of the memory cells in one or more of the arrays of memory cells$_{1-i}$ based on the one or more differences. This may include applying one or more voltages and/or levels of current to one or more of the resistances of the memory cells being reformed to reset resistive states of the memory cells. The one or more voltages and/or levels of current are applied such that each resulting difference in resistive states of the memory cells is greater than a predetermined difference. The voltages and/or levels of current applied to the one or more memory cells are greater than the voltages and/or levels of current supplied to the memory cells during read and/or write cycles.

The test module 170 may control the high-voltage generator 14, the voltage module 158, the driver modules$_{1-i}$, and the select modules$_{1-i}$ when performing a test and/or reforming one or more memory cells in the arrays of memory cells$_{1-i}$. The test module 170 may send control signals to one or more of the voltage module 158, the driver modules$_{1-i}$, and the select modules$_{1-i}$ instructing the voltage module 158, the driver modules$_{1-i}$, and the select modules$_{1-i}$ to generate voltages and/or levels of current to perform read, write and/or reforming operations.

The output modules$_{1-i}$ may each include, for example, sense amplifiers and latches similar to the sense amplifiers and latches shown in FIGS. 1-3. The sense amplifiers and latches are used to detect voltages and/or levels of current passing through the resistances of the memory cells. The detected voltages and/or levels of current and/or corresponding voltages and/or levels of current out of the sense amplifiers and/or the latches may be provided from the output modules$_{1-i}$, the sense amplifiers and/or the latches to the gap module 172. The gap module 172 then determines differences between resistive states of the resistances of the memory cells based on the voltages and/or levels of current received by the gap module 172.

Additional memory 180 may be included in the network device 150 and/or in the resistive memory 152, as shown. The memory 180 may be used to store the voltages and/or levels of current received by the gap module 172 and/or resistive state values determined by the gap module 172. The memory 180 may also be used to store differences in resistive states as determined by the gap module 172 and differences between (i) the voltages, the levels of current, and/or the resistive states, and (ii) corresponding predetermined threshold values. The memory 180 may also store addresses of memory cells to be reformed. The differences corresponding to resistive states of a memory cell may refer to differences between voltages, differences between levels of current, and/or differences between resistance values of the memory cell. Some or all of the above-stated voltages, levels of current, resistive state values, the stated differences, and/or addresses of memory cells to be reformed may be stored in one or more of the arrays of memory cells$_{1-i}$ rather than in the memory 180.

Figure 5:
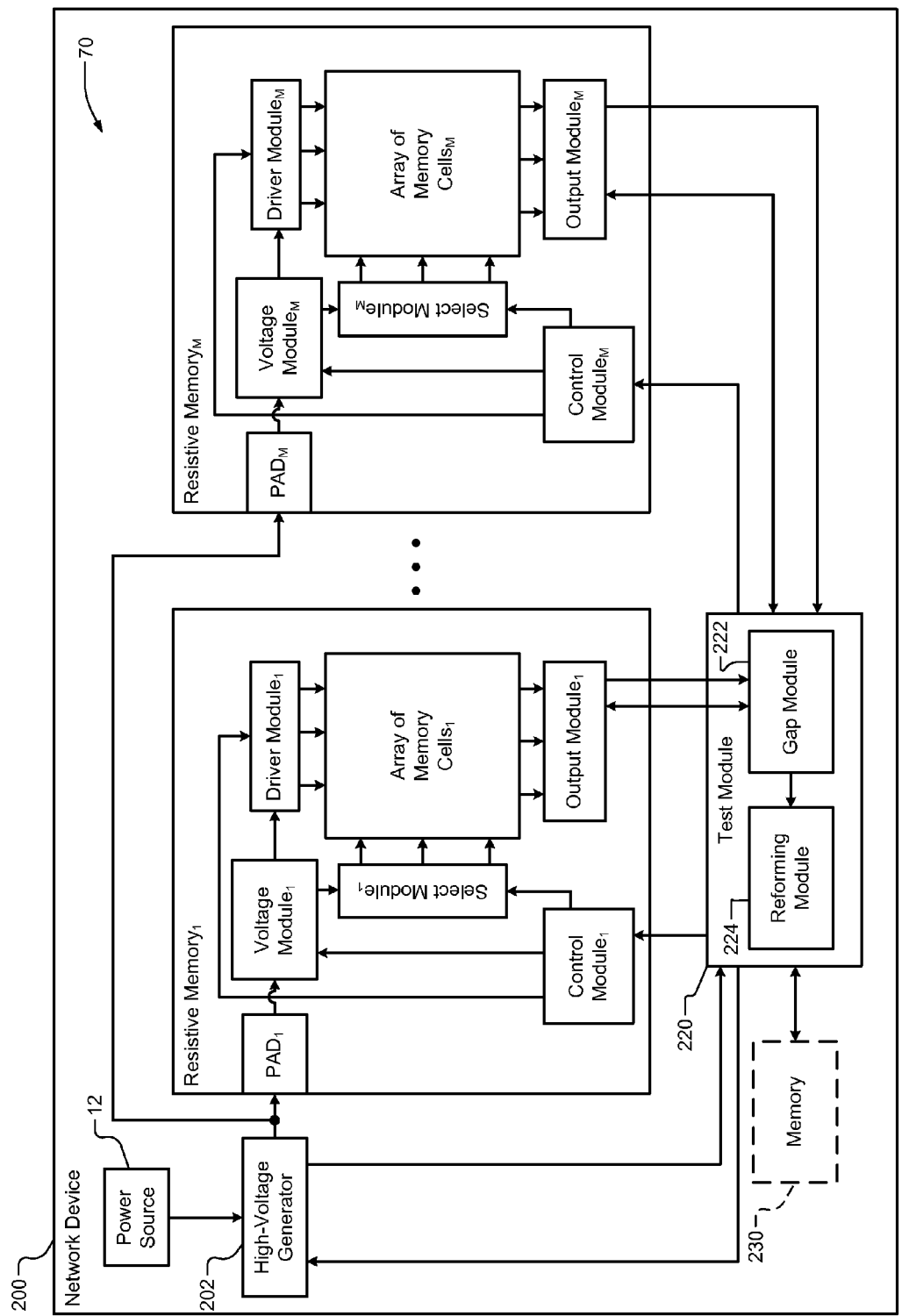
FIG. 5 is a functional block diagram of a network device incorporating multiple resistive memories and a reforming module in accordance with the present disclosure.

FIG. 5 shows a network device 200. The network device 200 may operate similar to the network device 10 of FIG. 1. FIG. 5 illustrates an implementation with multiple resistive memories having multiple respective arrays of memory cells. The network device 200 may be, for example, a computer, a mobile device, a cellular phone, a storage device, a network device, other device that includes resistive memory. The network device 200 includes the power source 12, a high-voltage generator 202, resistive memories$_{1-M}$, and a test module 220, where M is an integer greater than one. The high-voltage generator 202 may supply one or more predetermined voltages to pads$_{1-M}$ of the resistive memories$_{1-M}$ based on power received from the power source 12.

The resistive memories$_{1-M}$ may each be a storage drive, a flash drive, a memory card, a memory stick, an integrated circuit, or other device or circuit element that includes resistive memory cells. The resistive memories$_{1-M}$ may be plugged into the network device 200 via an interface between the network device 200 and the resistive memories$_{1-M}$ or may be implemented within the network device 200, as shown.

The resistive memories$_{1-M}$ include respective arrays of memory cells$_{1-M}$, voltage modules$_{1-M}$, control modules$_{1-M}$, driver modules$_{1-M}$, select modules$_{1-M}$, and output modules$_{1-M}$. Each of the arrays of memory cells$_{1-M}$ may include resistive memory cells and corresponding resistances similar to the arrays of memory cells shown in FIGS. 1-3. The arrays of memory cells$_{1-M}$ may include respective rows and columns that are selected via respective word lines and bit lines. Each of the arrays of memory cells$_{1-M}$ may operate similar to the array 20 of memory cells 22 of FIG. 1.

The voltage modules$_{1-M}$ may generate one or more voltages and provide the voltages to the corresponding driver modules$_{1-M}$ and select modules$_{1-M}$. In one implementation, the driver modules and the select modules in each of the resistive memories$_{1-M}$ may receive the same voltage from the corresponding voltage module. In another implementation, the driver modules and the select modules in each of the resistive memories$_{1-M}$ receive respective voltages from the corresponding voltage module. Two or more of the respective voltages may be the same or different.

The test module 220 includes a gap module 222 and a reforming module 224. The gap module 222 periodically, at predetermined times, after a predetermined number of read and/or write cycles, at random times, and/or at other suitable times performs one or more tests on the arrays of memory cells$_{1-M}$. Each test may include detecting voltages across and/or levels of current through one or more of the resistances of corresponding memory cells in the arrays of memory cells$_{1-M}$ to determine differences between resistive states of the corresponding memory cells. During a test, a first resistive state of a memory cell may be detected. The test module 220 and/or the gap module 222 may monitor when the first resistive state is changed to a second resistive state and/or may write to the memory cell to change the first resistive state of the memory cell to a second resistive state. The second resistive state being different than the first resistive state. The gap module 222 determines the difference between the first resistive state and the second resistive state.

The reforming module 224 monitors the one or more differences determined by the gap module 222. The reforming module 224 may reform one or more of the memory cells in one or more of the resistive memories$_{1-M}$ based on the one or more differences. This may include sending control signals to the control modules$_{1-M}$ to apply one or more voltages and/or levels of current to one or more of the resistances of the memory cells being reformed to reset resistive states of the memory cells. The one or more voltages and/or levels of current are applied such that each resulting difference in resistive states is greater than a predetermined difference. The voltages and/or levels of current applied to the one or more memory cells are greater than the voltages and/or levels of current supplied to the memory cells during read and/or write cycles.

The test module 220 send signals to the control modules$_{1-M}$ to control the high-voltage generator 202, the voltage modules$_{1-M}$, the driver modules$_{1-M}$, and the select modules$_{1-M}$ when performing a test and/or reforming one or more memory cells in the arrays of memory cells$_{1-M}$. The test module 220 may send control signals to one or more of the voltage modules$_{1-M}$, the driver modules$_{1-M}$, and the select modules$_{1-M}$ instructing the voltage modules$_{1-M}$, the driver modules$_{1-M}$, and the select modules$_{1-M}$ to generate voltages and/or levels of current to perform read, write and/or reforming operations.

The output modules$_{1-M}$ may each include, for example, sense amplifiers and latches similar to the sense amplifiers and latches shown in FIGS. 1-3. The sense amplifiers and latches are used to detect voltages and/or levels of current passing through the resistances of the memory cells. The detected voltages and/or levels of current and/or corresponding voltages and/or levels of current out of the sense amplifiers and/or the latches may be provided from the output modules$_{1-M}$, the sense amplifiers and/or the latches to the gap module 222. The gap module 222 then determines differences between resistive states of the resistances of the memory cells based on the voltages and/or levels of current received by the gap module 222.

Additional memory 230 may be included in one or more of the resistive memories$_{1-M}$ and/or in the network device 200, as shown. The memory 230 may be used to store the voltages and/or levels of current received by the gap module 222 and/or resistive state values determined by the gap module 222. The memory 230 may also be used to store differences in resistive states as determined by the gap module 222 and differences between (i) the voltages, the levels of current, and/or the resistive states, and (ii) corresponding predetermined threshold values. The memory 230 may also store addresses of memory cells to be reformed. The differences corresponding to resistive states of a memory cell may refer to differences between voltages, differences between levels of current, and/or differences between resistance values of the memory cell. Some or all of the above-stated voltages, levels of current, resistive state values, the stated differences, and/or addresses of memory cells to be reformed may be stored in one or more of the arrays of memory cells$_{1-M}$ rather than in the memory 230.

Figure 6:
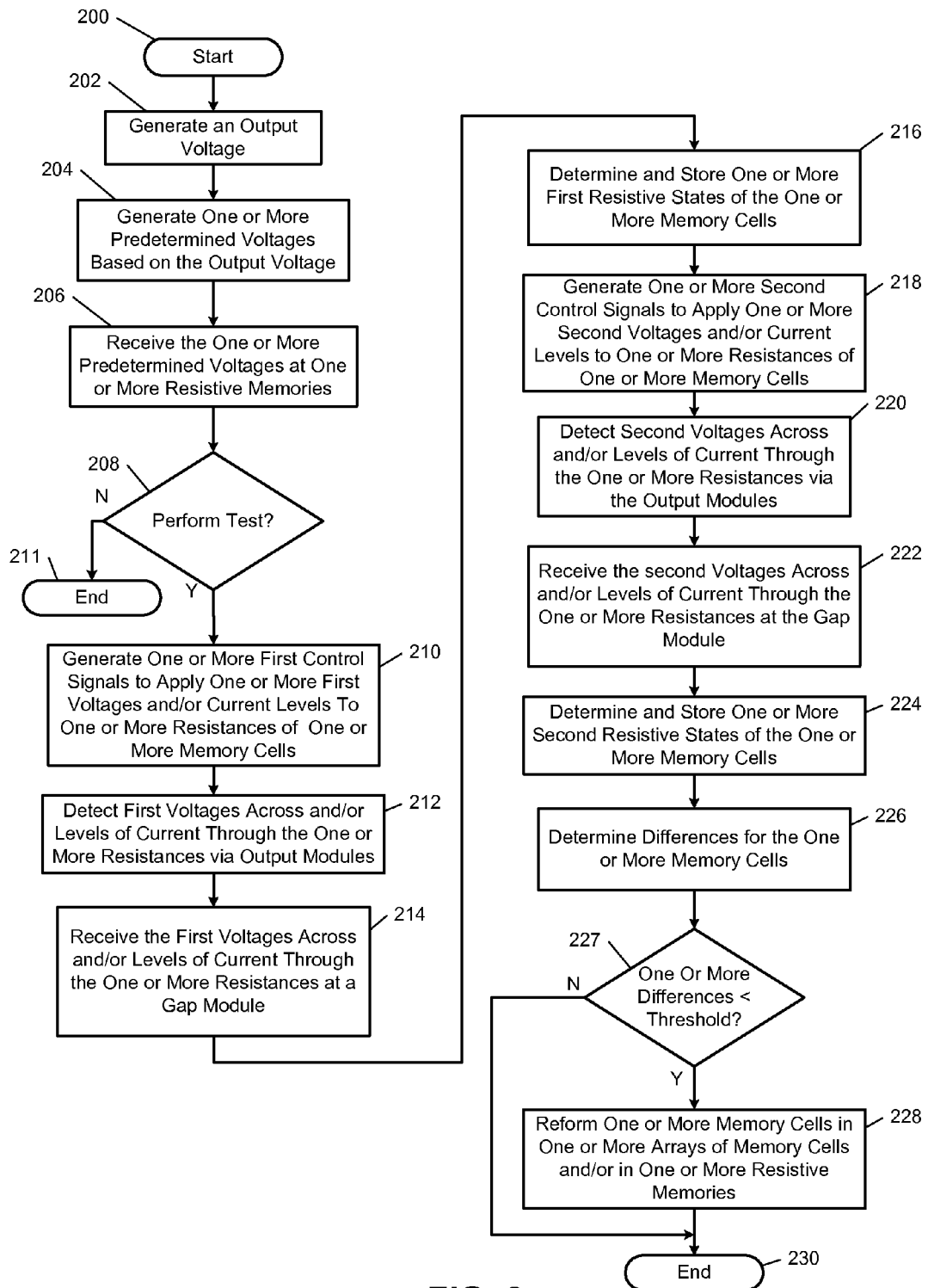
FIG. 6 illustrates a method of operating a network device in accordance with the present disclosure.

FIG. 6 illustrates a method of operating a network device in accordance with the present disclosure. The network devices disclosed herein (e.g., the network devices 10, 50, 100, 150 and 200 of FIGS. 2-5) may be operated using numerous methods, one example method is illustrated in FIG. 6. Although the following tasks are primarily described with respect to the implementations of FIGS. 1-5, the tasks may be easily modified to apply to other implementations of the present disclosure. The tasks may be iteratively performed.

The method may begin at 200. At 202, a power source (e.g., the power source 12) generates an output voltage. At 204, a high-voltage generator (e.g., one of the high-voltage generators 202) may generate one or more predetermined voltages based on the output voltage of the power source. This may include converting the output voltage to the one or more predetermined voltages.

At 206, one or more resistive memories (e.g., the resistive memories 16, 52, 102, 152, and 1-M of FIG. 5) receive the one or more predetermined voltages at respective pads (e.g., the pads 18, 54, 104, 154, and 1-M of FIG. 5).

At 208, a test module (e.g., one of the test modules 26, 53, 119, 170, and 220) determines whether to perform a test on one or more memory cells of the one or more resistive memories, as described above. Task 210 is performed if a test is to be performed, otherwise the method may end at 211.

At 210, a control module (e.g., one of the control modules 25, 59, 113, 159, and 1-M of FIG. 5) and/or the test module may generate one or more first control signals to instruct one or more voltage modules (e.g., one of the 24, 58, 112, 158, and 1-M of FIG. 5), one or more driver modules (e.g., one of the 27, 59, 114, 1-i of FIG. 4, and 1-M of FIG. 5), and/or one or more select modules (e.g., one of the 29, 60, 116, 1-i of FIG. 4, and 1-M of FIG. 5) to apply first voltages across and/or first levels of current through one or more resistances of the one or more memory cells. This is done to set the one or more resistances in first resistive states. The first resistive states may be HIGH resistive states.

At 212, one or more output modules (e.g., the 34, 62, 118, 1-i of FIG. 4, and 1-M of FIG. 5) of the one or more resistive memories may detect first voltages across and/or first levels of current through the one or more resistances. At 214, a gap module (e.g., one of the gap modules 30, 66, 120, 172, and 222) receives the first voltages and/or first levels of current from the one or more output modules.

At 216, the gap module may determine the one or more first resistive states of the one or more memory cells based on the first voltages and/or the first levels of current received from the one or more output modules. The one or more first resistive states may be stored in a nonvolatile memory and/or in one of the one or more resistive memories.

At 218, the control module and/or the test module may generate one or more second control signals to instruct one or more voltage modules, one or more driver modules, and/or one or more select modules to apply second voltages across and/or second levels of current through one or more resistances of the one or more memory cells. This is done to set the one or more resistances in second resistive states. The second resistive states may be LOW resistive states.

At 220, the one or more output modules of the one or more resistive memories may detect second voltages across and/or second levels of current through the one or more resistances. At 222, the gap module receives the second voltages and/or second levels of current from the one or more output modules.

At 224, the gap module may determine the one or more second resistive states of the one or more memory cells based on the second voltages and/or the second levels of current received from the one or more output modules. The one or more second resistive states may be stored in the nonvolatile memory and/or in one of the one or more resistive memories.

At 226, the gap module may, for each of the one or more memory cells, determine a difference between the corresponding first resistive state and the corresponding second resistive state.

At 227, the reforming module (e.g., one of the reforming modules 32, 68, 122, 174, and 224) determines whether to reform one or more memory cells in the one or more resistive memories based on one or more of the differences determined at 226. If one or more of the differences is less than a predetermined threshold, task 228 is performed, otherwise the method may end at 230. If a difference for a memory cell is less than the predetermined difference, one or more memory cells may be reformed. The memory cells to be reformed may include: the memory cell having the difference less than the predetermined difference; one or more memory cells in the same array; one or more memory cells in different arrays; one or more memory cells in the same resistive memory; and/or one or more memory cells in different resistive memories. One or more entire arrays of memory cells and/or one or more entire memories may be reformed. The addresses of the memory cells to be reformed may be stored in the arrays of memory cells and/or in other memory (e.g., one of the memories 40, 74, 126, 180, 230).

At 228, the reforming module reforms the one or more memory cells in the one or more resistive memories. This may include the reforming module generating third control signals to instruct the one or more control modules, voltage modules, the one or more driver modules and/or the one or more select modules such that third voltages and/or third levels of current are applied to the resistances of the memory cells being reformed. The third voltages may be greater than the first voltages and the second voltages. The third levels of current may be greater than the first levels of current and the second levels of current. The third voltages and/or third levels of current provide high electrical fields, which reallocate oxygen ion vacancies to states that are similar to states provided during initial forming. The reforming may include increasing the first resistive state and/or decreasing the second resistive state. Task 202 may be performed subsequent to task 228 or the method may end at 230, as shown.

Figure 7:
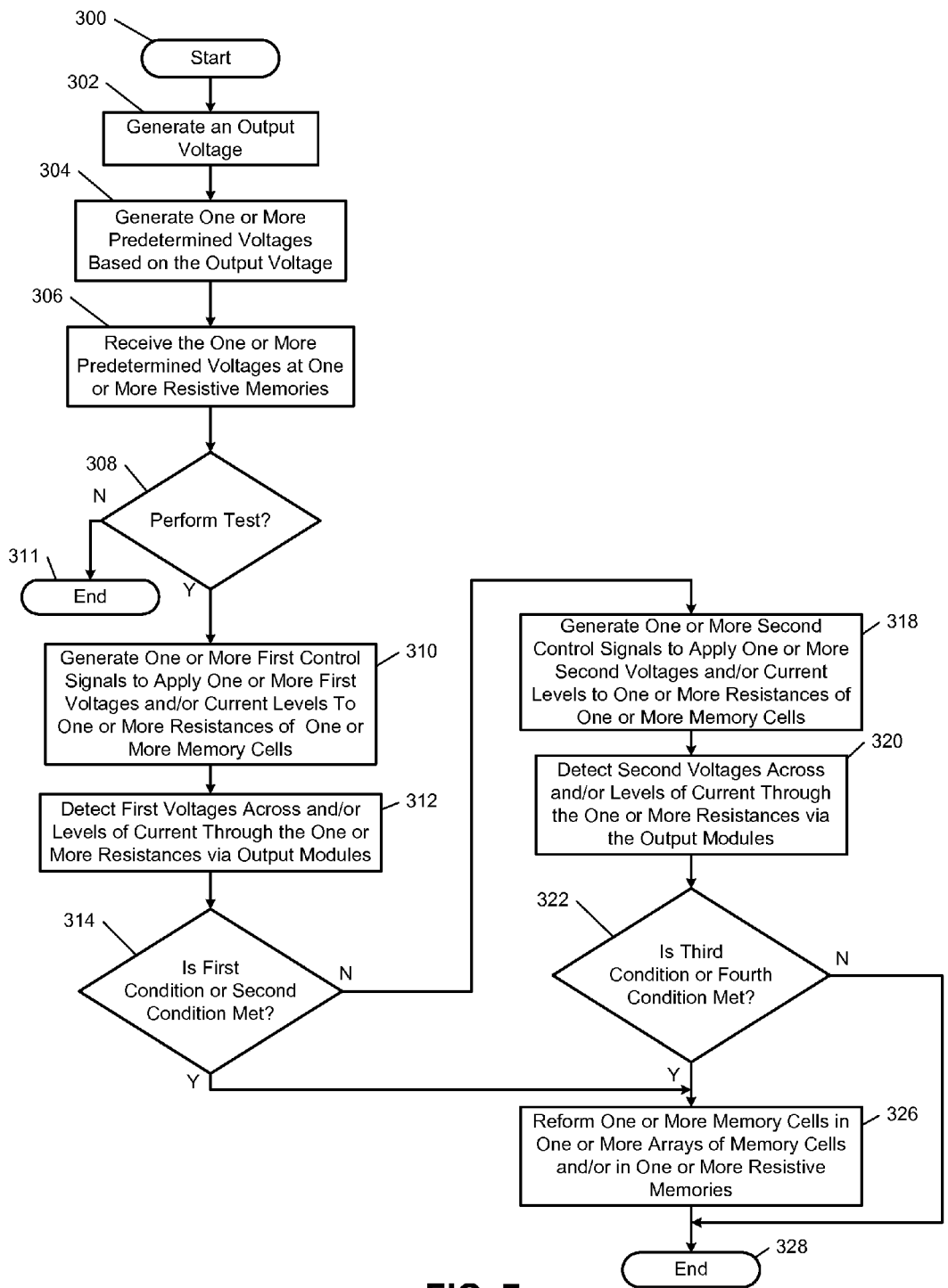
FIG. 7 illustrates another method of operating a network device in accordance with the present disclosure.

FIG. 7 illustrates another method of operating a network device in accordance with the present disclosure. The method of FIG. 7 may be applied to various network devices (e.g., the network devices 10, 50, 100, 150 and 200 of FIGS. 2-5). Although the following tasks are primarily described with respect to the implementations of FIGS. 1-5, the tasks may be easily modified to apply to other implementations of the present disclosure. The tasks may be iteratively performed.

The method may begin at 300. At 302, a power source (e.g., the power source 12) generates an output voltage. At 304, a high-voltage generator (e.g., one of the high-voltage generators 202) may generate one or more predetermined voltages based on the output voltage of the power source. This may include converting the output voltage to the one or more predetermined voltages.

At 306, one or more resistive memories (e.g., the resistive memories 16, 52, 102, 152, and 1-M of FIG. 5) receive the one or more predetermined voltages at respective pads (e.g., the pads 18, 54, 104, 154, and 1-M of FIG. 5).

At 308, a test module (e.g., one of the test modules 26, 53, 119, 170, and 220) determines whether to perform a test on one or more memory cells of the one or more resistive memories, as described above. Task 310 is performed if a test is to be performed, otherwise the method may end at 311.

At 310, a control module (e.g., one of the control modules 25, 59, 113, 159, and 1-M of FIG. 5) and/or the test module may generate one or more first control signals to instruct one or more voltage modules (e.g., one of the 24, 58, 112, 158, and 1-M of FIG. 5), one or more driver modules (e.g., one of the 27, 59, 114, 1-i of FIG. 4, and 1-M of FIG. 5), and/or one or more select modules (e.g., one of the 29, 60, 116, 1-i of FIG. 4, and 1-M of FIG. 5) to apply first voltages across and/or first levels of current through one or more resistances of the one or more memory cells. This is done to set the one or more resistances in first resistive states. The first resistive states may be HIGH resistive states.

At 312, one or more output modules (e.g., the 34, 62, 118, 1-i of FIG. 4, and 1-M of FIG. 5) of the one or more resistive memories may detect first voltages across and/or first levels of current through the one or more resistances.

At 314, the output modules, sense amplifiers (e.g., sense amplifiers 36, 70, and 124), one or more threshold modules (e.g., threshold modules 39, 71, 126) and/or a gap module (e.g., one of the gap modules 30, 66, 120, 172, and 222) compare the first voltages and/or first levels of current to one or more first predetermined threshold values. Voltages and/or levels of current greater than second predetermined threshold values may indicate first resistive states (or HIGH states). The second predetermined threshold values may be less than the first predetermined threshold values. The output modules, the sense amplifiers, the threshold modules and/or a gap module may also determine one or more first differences between (i) the first voltages and/or levels of current, and (ii) one or more third predetermined threshold values.

If one or more of the first voltages and/or first levels of current are less than the one or more first predetermined threshold values (referred to as the first condition) or if one or more of the first differences is less than third predetermined threshold values (referred to as the second condition), then task 326 may be performed, otherwise task 318 is performed. If task 326 is performed, the result of task 314 is TRUE and the corresponding tested memory cells have failed the testing process.

If task 314 is performed by an output module, a sense amplifier, or a threshold module, then the output module, the sense amplifier, or the threshold module may signal the corresponding control module, test module and/or reforming module that the first condition and/or the second condition are met. The output module, the sense amplifier, or the threshold module may also provide one or more addresses of corresponding memory cells that have satisfied the first condition or the second condition. The addresses may be stored in memory, as described above. The reforming module may reform these memory cells at a later time.

At 318, the control module and/or the test module may generate one or more second control signals to instruct one or more voltage modules, one or more driver modules, and/or one or more select modules to apply second voltages across and/or second levels of current through one or more resistances of the one or more memory cells. This is done to set the one or more resistances in second resistive states. The second resistive states may be LOW resistive states.

At 320, the one or more output modules of the one or more resistive memories may detect second voltages across and/or second levels of current through the one or more resistances.

At 322, the output modules, sense amplifiers (e.g., sense amplifiers 36, 70, and 124), one or more threshold modules (e.g., threshold modules 39, 71, 126) and/or a gap module (e.g., one of the gap modules 30, 66, 120, 172, and 222) compare the second voltages and/or second levels of current to one or more fourth predetermined threshold values. Voltages and/or levels of current less than the fifth predetermined threshold values may indicate second resistive states (or LOW states). The fifth predetermined threshold values may be greater than the fourth predetermined threshold values. The fifth predetermined threshold values may be equal to or within a predetermined range of the second predetermined threshold values. The output modules, the sense amplifiers, the threshold modules and/or a gap module may also determine one or more second differences between (i) the second voltages and/or levels of current, and (ii) the one or more fourth predetermined threshold values.

If one or more of the second voltages and/or second levels of current are greater than the one or more fourth predetermined threshold values (referred to as the third condition) or if one or more of the second differences is less than sixth predetermined threshold values (referred to as the fourth condition), then task 326 may be performed, otherwise task 328 is performed. If task 326 is performed, the result of task 322 is TRUE and the corresponding tested memory cells have failed the testing process.

If task 322 is performed by an output module, a sense amplifier, or a threshold module, then the output module, the sense amplifier, or the threshold module may signal the corresponding control module, test module and/or reforming module that the third condition and/or the fourth condition are met. The output module, the sense amplifier, or the threshold module may also provide one or more addresses of corresponding memory cells that have satisfied the third condition or the fourth condition. The addresses may be stored in memory, as described above. The reforming module may reform these memory cells at a later time.

At 326, the reforming module reforms one or more memory cells. The memory cells to be reformed may include: one or more memory cells in the same array; one or more memory cells in different arrays; one or more memory cells in the same resistive memory; and/or one or more memory cells in different resistive memories. One ore more memory cells that were not tested may be reformed based on the results of one or more memory cells that were tested and failed the testing process. One or more entire arrays of memory cells and/or one or more entire memories may be reformed. The addresses of the memory cells to be reformed may be stored in the arrays of memory cells and/or in other memory (e.g., one of the memories 40, 74, 126, 180, 230). This may include the reforming module generating third control signals to instruct the one or more control modules, voltage modules, the one or more driver modules and/or the one or more select modules such that third voltages and/or third levels of current are applied to the resistances of the memory cells being reformed.

The third voltages may be greater than or equal to the first voltages and the second voltages and/or voltages used during read and/or write cycles. The third voltages may also be greater than or equal to the corresponding first predetermined threshold values to attempt to (i) increase the voltages read for the first resistive states above corresponding seventh predetermined threshold values, and (ii) decrease the voltages read for the second resistive states below corresponding eighth predetermined threshold values. The seventh predetermined threshold values being greater than or equal to the first predetermined threshold values. The eighth predetermined threshold values being less than or equal to the fourth predetermined threshold values.

Similarly, the third levels of current may be greater than or equal to the first levels of current and the second levels of current and/or levels of current used during read and/or write cycles. The third levels of current may also be greater than or equal to the corresponding first predetermined threshold values to attempt to (i) increase the levels of current read for the first resistive states above corresponding seventh predetermined threshold values, and (ii) decrease the levels of current read for the second resistive states below corresponding eighth predetermined threshold values.

The third voltages and/or third levels of current provide high electrical fields, which reallocate oxygen ion vacancies to states that are similar to states provided during initial forming. The reforming may include increasing the first resistive states and/or decreasing the second resistive states.

The third voltages across and/or the third levels of current through the one or more resistances may be applied for predetermined durations of time. The predetermined durations of time may be longer than durations of time used when applying voltages and/or levels of current during read and/or write cycles. Step 326 may be performed one or more times for the same memory cells to reset the first resistive states and the second resistive states.

Task 302 may be performed subsequent to task 326 or the method may end at 328, as shown. In one implementation, task 326 is not performed unless the results of both of tasks 316 and 322 are TRUE.

In addition to or as alternative to reforming, failed memory cells may be replaced with redundant memory cells. For example, if after reforming the voltages and/or levels of current detected when reading the first resistive states are less than the corresponding first predetermined threshold values and/or the voltages and/or levels of current detected when reading the second resistive states are greater than the corresponding second predetermined threshold values, then the corresponding failed memory cells may be replaced with redundant memory cells. The redundant memory cells may be in the same array of memory cells as the failed memory cells. Replacement of memory cells refers to the use of the redundant memory cells instead of using the failed memory cells.

The above-described tasks of FIGS. 6 and 7 are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

Although the terms first, second, third, etc. may be used herein to describe various multiplexers, sense amplifiers, latches, outputs, states, elements, and/or components, these items should not be limited by these terms. These terms may only be used to distinguish one item from another item. Terms such as "first," "second," and other numerical terms when used herein do not imply a sequence or order unless clearly indicated by the context. Thus, a first item discussed below could be termed a second item without departing from the teachings of the example implementations.

Various terms are used herein to describe the physical relationship between elements. When a first element is referred to as being "on", "engaged to", "connected to", or "coupled to" a second element, the first element may be directly on, engaged, connected, disposed, applied, or coupled to the second element, or intervening elements may be present. In contrast, when an element is referred to as being "directly on", "directly engaged to", "directly connected to", or "directly coupled to" another element, there may be no intervening elements present. Other words used to describe the relationship between elements should be interpreted in a like fashion (e.g., "between" versus "directly between", "adjacent" versus "directly adjacent", etc.).

The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A memory comprising:
   a memory cell having a first state and a second state, wherein the second state is different than the first state;
   a first module configured to, subsequent to an initial forming of the memory cell to activate the memory cell and subsequent to a read cycle or a write cycle of the memory cell, determine (i) a first difference between the first state and a first predetermined threshold, or (ii) a second difference between the first state and the second state; and
   a second module configured to, subsequent to the first module determining the first difference or the second difference, reform the memory cell to reset and increase the first difference or the second difference, wherein the second module is configured to, during the reforming of the memory cell, apply a first voltage to the memory cell, and wherein the first voltage is greater than a voltage applied to the memory cell during the read cycle or the write cycle.

2. The memory of claim 1, wherein the initial forming of the memory cell is performed subsequent to manufacturing of the memory and prior to any read or write operations of the memory.

3. The memory of claim 1, wherein the second module is configured to, during the reforming of the memory cell, increase the first difference or the second difference to be greater than or equal to a predetermined difference.

4. The memory of claim 1, wherein:
   the second module is configured to, during the reforming of the memory cell, increase the first difference or the second difference to be equal to an initial difference; and
   the first difference or the second difference was equal to the initial difference subsequent to the initial forming of the memory cell and prior to the read cycle or the write cycle of the memory cell.

5. The memory of claim 1, wherein the second module is configured to, during the reforming of the memory cell, increase both the first difference and the second difference.

6. The memory of claim 1, wherein:
   the first state is indicative of a first resistance of the memory cell;
   the second state is indicative of a second resistance of the memory cell; and
   the second module is configured to, during the reforming of the memory cell, increase a difference between the first resistance and the second resistance.

7. The memory of claim 1, further comprising a second memory cell, wherein the second module is configured to, based on the first difference or the second difference, reform the second memory cell.

8. A memory comprising:
- a memory cell having a first state and a second state, wherein the second state is different than the first state;
- a first module configured to, subsequent to an initial forming of the memory cell to activate the memory cell and subsequent to a read cycle or a write cycle of the memory cell, determine (i) a first difference between the first state and a first predetermined threshold, or (ii) a second difference between the first state and the second state; and
- a second module configured to, subsequent to the first module determining the first difference or the second difference, reform the memory cell to reset and increase the first difference or the second difference, wherein the second module is configured to, during the reforming of the memory cell, apply a first level of current to the memory cell, and wherein the first level of current is greater than a level of current applied to the memory cell during the read cycle or the write cycle.

9. The memory of claim 8, wherein the initial forming of the memory cell is performed subsequent to manufacturing of the memory and prior to any read or write operations of the memory.

10. The memory of claim 8, wherein the second module is configured to, during the reforming of the memory cell, increase the first difference or the second difference to be greater than or equal to a predetermined difference.

11. The memory of claim 8, wherein:
- the second module is configured to, during the reforming of the memory cell, increase the first difference or the second difference to be equal to an initial difference; and
- the first difference or the second difference was equal to the initial difference subsequent to the initial forming of the memory cell and prior to the read cycle or the write cycle of the memory cell.

12. The memory of claim 8, wherein the second module is configured to, during the reforming of the memory cell, increase both the first difference and the second difference.

13. The memory of claim 8, wherein:
- the first state is indicative of a first resistance of the memory cell;
- the second state is indicative of a second resistance of the memory cell; and
- the second module is configured to, during the reforming of the memory cell, increase a difference between the first resistance and the second resistance.

14. The memory of claim 8, further comprising a second memory cell, wherein the second module is configured to, based on the first difference or the second difference, reform the second memory cell.

15. A method for reforming a memory cell of a memory, wherein the memory cell has a first state and a second state, and wherein the second state is different than the first state, the method comprising
- subsequent to an initial forming of the memory cell to activate the memory cell and subsequent to a read cycle or a write cycle of the memory cell, determining (i) a first difference between the first state and a first predetermined threshold, or (ii) a second difference between the first state and the second state; and
- subsequent determining the first difference or the second difference, reforming the memory cell to reset and increase the first difference or the second difference, wherein the reforming of the memory cell includes applying a first voltage to the memory cell, and wherein the first voltage is greater than a voltage applied to the memory cell during the read cycle or the write cycle.

16. The method of claim 15, wherein:
- the initial forming of the memory cell is performed subsequent to manufacturing of the memory and prior to any read or write operations of the memory; and
- the reforming of the memory cell includes increasing the first difference or the second difference to be greater than or equal to a predetermined difference.

17. The method of claim 15, wherein:
- the initial forming of the memory cell is performed subsequent to manufacturing of the memory and prior to any read or write operations of the memory;
- the reforming of the memory cell includes increasing the first difference or the second difference to be equal to an initial difference; and
- the first difference or the second difference was equal to the initial difference subsequent to the initial forming of the memory cell and prior to the read cycle or the write cycle of the memory cell.

18. The method of claim 15, wherein the reforming of the memory cell includes increasing both the first difference and the second difference.

19. The method of claim 15, wherein:
- the first state is indicative of a first resistance of the memory cell;
- the second state is indicative of a second resistance of the memory cell; and
- the reforming of the memory cell includes increasing a difference between the first resistance and the second resistance.

20. The method of claim 15, further comprising, based on the first difference or the second difference, reforming a second memory cell of the memory.

* * * * *